United States Patent [19]
Kitamura et al.

[11] Patent Number: 6,124,695
[45] Date of Patent: Sep. 26, 2000

[54] CARTESIAN COORDINATES ROBOT

[75] Inventors: Naoyuki Kitamura, Yamanashi; Mamoru Inoue; Akira Kabeshita, both of Hirakata; Takeshi Takeda, Yamanashi, all of Japan

[73] Assignee: Matsushita Electric Industrial Co., Ltd., Osaka, Japan

[21] Appl. No.: 09/269,059

[22] PCT Filed: Sep. 16, 1997

[86] PCT No.: PCT/JP97/03256

§ 371 Date: Mar. 18, 1999

§ 102(e) Date: Mar. 18, 1999

[87] PCT Pub. No.: WO98/12024

PCT Pub. Date: Mar. 26, 1998

[30] Foreign Application Priority Data

Sep. 19, 1996 [JP] Japan ................................. 8-246764

[51] Int. Cl.⁷ .................................................. B64C 17/06
[52] U.S. Cl. ............................ 318/649; 395/85; 395/86; 395/87; 395/89; 901/41
[58] Field of Search ................................ 395/85, 86, 87, 395/89; 901/41; 318/649

[56] References Cited

U.S. PATENT DOCUMENTS 5,761,390  6/1998  Koshishiba et al. ...................... 395/85
5,987,349  11/1999  Schulz ....................................... 395/85

FOREIGN PATENT DOCUMENTS 3-221385  8/1991  Japan .

*Primary Examiner*—Karen Masih
*Attorney, Agent, or Firm*—Wenderoth, Lind & Ponack, L.L.P.

[57] ABSTRACT

Provided is a rectangular coordinate type robot, in which spaced-apart first tables are provided with respective first moving units that are guided along the first tables, and a second table has its one end connected to the first moving unit provided for one of the first tables and the other end connected to the first moving unit provided for the other first table. The end portions of the second table and the first moving units are connected with each other via connecting members that have a rigidity in the movement direction of the first moving unit and a resiliency in the direction extending along the second table.

16 Claims, 11 Drawing Sheets

CARTESIAN COORDINATES ROBOT

TECHNICAL FIELD

The present invention relates to a rectangular coordinate (Cartesian coordinate) type robot.

BACKGROUND ART

In recent years, robots for use in mounting electronic components or the like are required to have a longer stroke together with high speed and high accuracy.

Conventionally, as a robot for executing a variety of operations with high positional accuracy on a workpiece such as a board, there is the robot shown in FIG. 11 and FIG. 12.

This is provided with an X-axis table 52 supported in a cantilever style on an Y-axis table 51. The X-axis table 52 can be positioned in an arbitrary position in the Y-direction. The X-axis table 52 is mounted with a working head section 53 that can be positioned in an arbitrary position in the X-direction. The working head section 53 is mounted with a position recognition means 54 for recognizing the position of a workpiece W and a working member 55 such as a component suction nozzle, which are spaced apart at a specified distance D in the X-direction as shown in FIG. 12.

This robot recognizes with high accuracy the working position of the working head section 53 by means of the position recognition means 54 by moving the working head section 53 into the working position of the workpiece W by means of the Y-axis table 51 and the X-axis table 52, and moves the working head section 53 by means of the Y-axis table 51 or the X-axis table 52 on the basis of the recognized working position and the above-mentioned distance D, thereby guiding the working member 55 into the working position for the execution of the operation.

The X-axis table 52 is supported in a cantilever style on the Y-axis table 51, and this causes an issue that vibration tends to occur when the X-axis table 52 is made to have a long stroke in correspondence to the workpiece W and an issue that it takes a period of time to position the working head section 53 when stopping a high-speed operation. A bolt for fastening the Y-axis table 51 to the X-axis table 52 tends to become loose. There is a further issue that the positioning accuracy of the working head section 53 is significantly reduced by the yawing and rolling of the Y-axis table 51.

A rectangular coordinate type robot (Japanese Laid-Open Patent Publication No. 3-221385) that we have already proposed in order to solve the above-mentioned issues has a construction as shown in FIG. 13 and FIG. 14.

A pair of Y-axis tables 1 and 2 are arranged parallel to each other, and the Y-axis tables 1 and 2 are provided with first moving units 4 and S that move while being guided along the Y-axis tables 1 and 2, respectively.

Between the Y-axis tables 1 and 2 is provided an X-axis table 3 perpendicular to the Y-axis tables 1 and 2. The X-axis table 3 is provided with a second moving unit 21 that is guided along the X-axis table 3.

One end portion of the X-axis table 3 and the first moving unit 4 located on the side of the one Y-axis table 1 are engaged with each other while being pivotal around the axes that are perpendicular to the Y-axis and X-axis tables. The other end portion of the X-axis table 3 and the first moving unit 5 located on the side of the other Y-axis table 2 are engaged and supported with each other while being pivotal around the axes that are perpendicular to the Y-axis and X-axis tables and slidable in the axial direction of the X-axis table 3.

The second moving unit 21 is provided with a workpiece position recognition means 25 and a working member 26.

In more detail, the Y-axis tables 1 and 2 are internally provided with threaded shafts (implemented by, for example, ball screws) 6 and 7 and motors 8 and 9 for rotating these threaded shafts 6 and 7. The first moving units 4 and 5 are meshed with the respective threaded shafts 6 and 7 via nuts (not shown).

The X-axis table 3 is supported and engaged pivotally with the first moving units 4 and 5 located on the Y-axis tables 1 and 2 and slidably in the axial direction of the X-axis table 3.

That is, the first moving units 4 and 5 located on the Y-axis tables 1 and 2 have their center portions provided with engagement shafts 11 and 12 that are protruding in the vertical direction (in the direction perpendicular to both the Y-axis table and the X-axis table) as shown in FIG. 15.

To one end portion of the X-axis table 3 is fixed a connecting member 14 that is pivotally engaged with the engagement shaft 11 of the first moving unit 4 via a bearing 13. To the other end portion of the X-axis table 3 are fixed fixing sections 15a of a slide block 15 as shown in FIG. 16, and a movable section 15b that is made slidable between the fixing sections 15a of the slide block 15 and is pivotally engaged with the engagement shaft 12 of the first moving unit 5 via a bearing 16.

Therefore, by driving the motors 8 and 9 in synchronism, the X-axis table 3 can be moved into an arbitrary position along the Y-axis tables 1 and 2 via the first moving units 4 and 5.

The second moving unit 21 provided on the X-axis table 3 is provided with a threaded shaft (implemented by, for example, a ball screw) 22 and a motor 23 for rotating this threaded shaft 22 arranged inside the X-axis table 3 as shown in FIG. 13, and the second moving unit 21 is meshed with the threaded shaft 22 via a nut 24.

The second moving unit 21 has its one side surface provided with a working member mounting plate 27 that is movable in the axial direction of the X-axis table 3. The second moving unit 21 is provided with a threaded shaft (implemented by, for example, a ball screw) 29 and a motor 30 for rotating this threaded shaft 29, while a nut 28 attached to the back surface of the working member mounting plate 27 is meshed with the threaded shaft 29.

The working member mounting plate 27 is mounted with the workpiece position recognition means (e.g., a camera) 25 and a workpiece working tool, which is an example of the working member 26. The reference numerals 31 and 32 denote cable units for transmitting a power signal and a control signal.

However, the rectangular coordinate type robot shown in FIG. 13 through FIG. 16 has the disadvantages of a deterioration in accuracy due to the looseness of the rotating portions occurring when performing the positioning in the Y-axis direction of a $Y_1$-axis and a $Y_2$-axis as well as the disadvantage that it takes a period of time to settle the positioning.

It has also been unable to provide a sufficient added weight of the rotational and slide mechanisms for the issue in terms of space.

Furthermore, in regard to the positioning accuracy, the component size has been reduced and component lead pitch has been reduced (0.3-mm pitch) in recent years, and accordingly, a mounting accuracy of ±25 μm is required. However, there has been a vibration of the maximum amplitude of about 30 μm in the positioning stage according to the conventional system, and a settling time (time to the achievement of settlement within a range of ±5 μm) of about 400 msec has currently been required.

The present invention has the object of providing a rectangular coordinate type robot capable of executing a positioning operation without reducing the rigidity when moving an X-axis table in a Y-axis direction of a $Y_1$-axis and a $Y_2$-axis.

SUMMARY OF THE INVENTION

The rectangular coordinate type robot of the present invention is a rectangular coordinate type robot, characterized in that first tables juxtaposed with a space therebetween are provided with respective first moving units that are guided along the first tables, and a second table has its one end connected to the first moving unit provided for one of the first tables and the other end connected to the first moving unit provided for the other first table. The end portions of the second table and the first moving units are connected with each other via connecting members that have a rigidity in a movement direction of the first moving unit and a resiliency in the direction extending along the second table.

According to the present invention, a rectangular coordinate type robot that can execute positioning without reducing the rigidity when moving the second table in the Y25 axis direction can be obtained.

BRIEF DESCRIPTION OF DRAWINGS

These and other aspects and features of the present invention will become clear from the following description taken in conjunction with the preferred embodiments thereof with reference to the accompanying drawings, in which.

DETAILED DESCRIPTION OF THE INVENTION

Figure 1A:
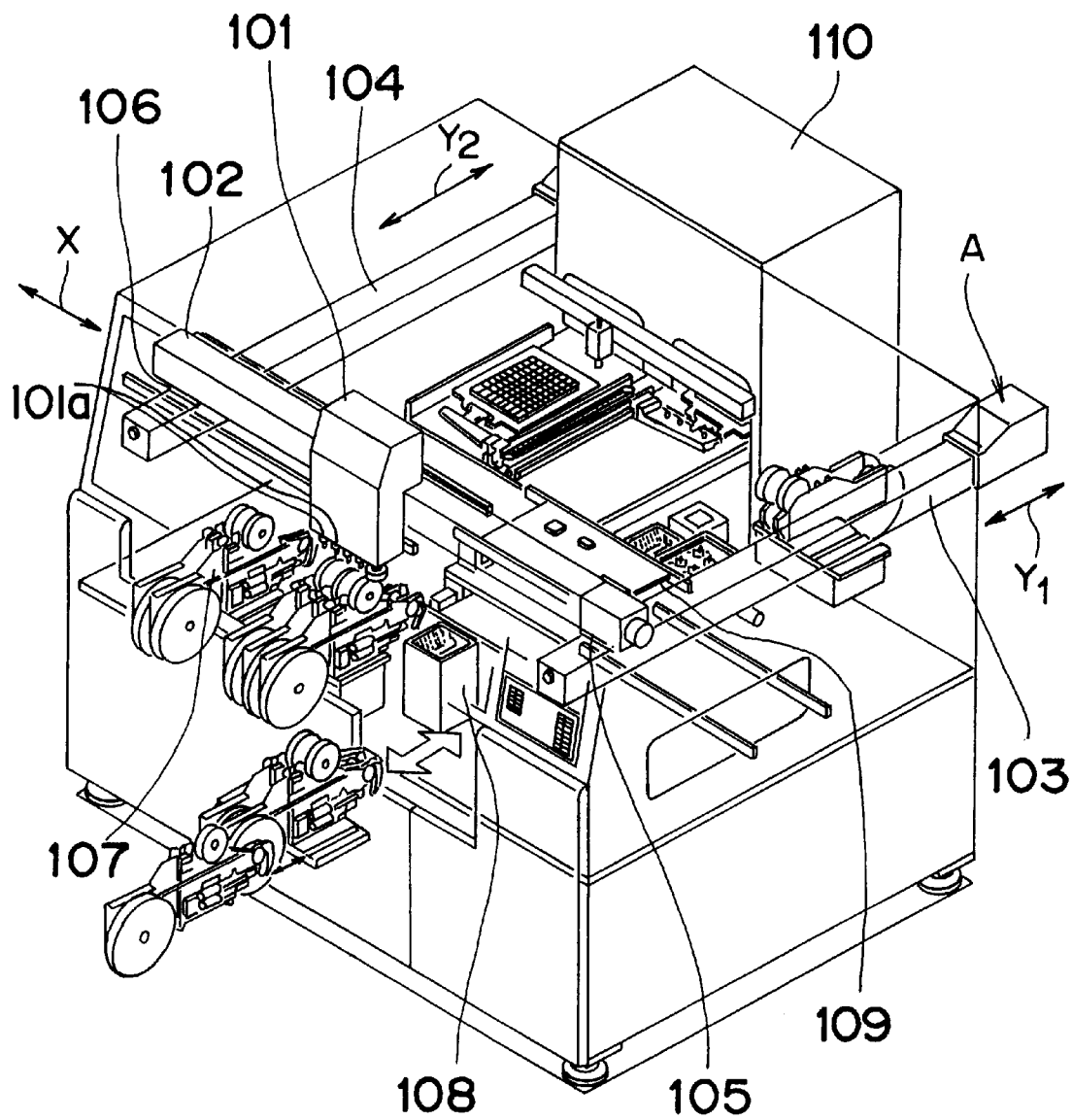
FIG. 1A is a view showing the construction of a component mounting apparatus mounted with a rectangular coordinate type robot according to a first embodiment of the present invention.

Before the description of the present invention proceeds, it is to be noted that like parts are designated by like reference numerals throughout the accompanying drawings.

The outline of the present invention will be described first.

A rectangular coordinate type robot according to a first aspect of the present invention is a rectangular coordinate type robot characterized by providing: a pair of first tables that are juxtaposed with a space therebetween and provided with first moving units, respectively, guided along the first tables; a second table having its one end connected to the first moving unit provided for one of the first tables and the other end connected to the first moving unit provided for the other first table; and a second moving unit that moves while being guided along the second table and is provided with a working member. At least one connecting portion of a of one end of the second table and the first moving unit and a connecting portion of the other end of the second table and the first moving unit is connected via a connecting member having a rigidity in a movement direction in which the first moving unit moves and a resiliency in a direction extending along the second table.

According to this construction, movement can be made smooth by reducing a load in the driving stage with respect to the errors of the $Y_1$-axis and the $Y_2$-axis in the X-axis direction due to the resiliency of the connecting member. In addition, since the connecting members have the rigidity in the direction of the $Y_1$-axis and the $Y_2$-axis, the settling time in the positioning stage can be reduced and the movement operation can be achieved without deteriorating the positioning accuracy.

A rectangular coordinate type robot according to a second aspect of the present invention is a rectangular coordinate type robot characterized by providing: a pair of first tables that are juxtaposed with interposition of an interval and provided with first moving units, respectively, guided along the first tables; a second table having its one end connected to the first moving unit provided for one of the first tables and the other end connected to the first moving unit provided for the other first table; and a second moving unit that moves while being guided along the second table and is provided with a working member. One end of the second table is fixed to the first moving unit, and a connecting portion of the other end of the second table and the first moving unit is connected via a connecting member having a rigidity in a movement direction in which the first moving unit moves and a resiliency in a direction extending along the second table.

A rectangular coordinate type robot according to a third aspect of the present invention is based on the first or second aspect and characterized in that the connecting member is provided by a plate-shaped block that has its center portion made to serve as a fixed side to be fixed to the first moving unit, the plate-shaped block has its peripheral portion made to serve as a movable side to be fixed to the second table, and through holes are formed in the plate-shaped block so that the fixed side and the movable side of the plate-shaped block are connected via thinned portions.

A rectangular coordinate type robot according to a fourth aspect of the present invention is based on the third aspect and characterized in that the through holes formed through the plate-shaped block so that the fixed side and the movable side of the plate-shaped block are connected via the thinned portions are slit grooves.

A rectangular coordinate type robot according to a fifth aspect of the present invention is based on the third or fourth aspect and characterized in that the thinned portions are portions that extend in the movement direction in which the first moving unit moves so as to have the rigidity in the movement direction and is thin in a direction crossing the movement direction so as to have the resiliency in the crossing direction.

A rectangular coordinate type robot according to a sixth aspect of the present invention is based on any one of the first through fifth aspects and characterized in that the connecting members have rigidity in the movement direction of the first moving unit and have resiliency in the direction extending along the second table, for reducing sliding resistance by allowing elastic deformation in response to a deviation in the direction extending along the second table due to mounting and processing accuracy of the pair of first tables.

The rectangular coordinate type robots according to embodiments of the present invention will be described below with reference to FIG. 1A through FIG. 10.

<First Embodiment>

FIG. 1A through FIG. 6 show a rectangular coordinate type robot A of a first embodiment of the present invention.

Figure 12:
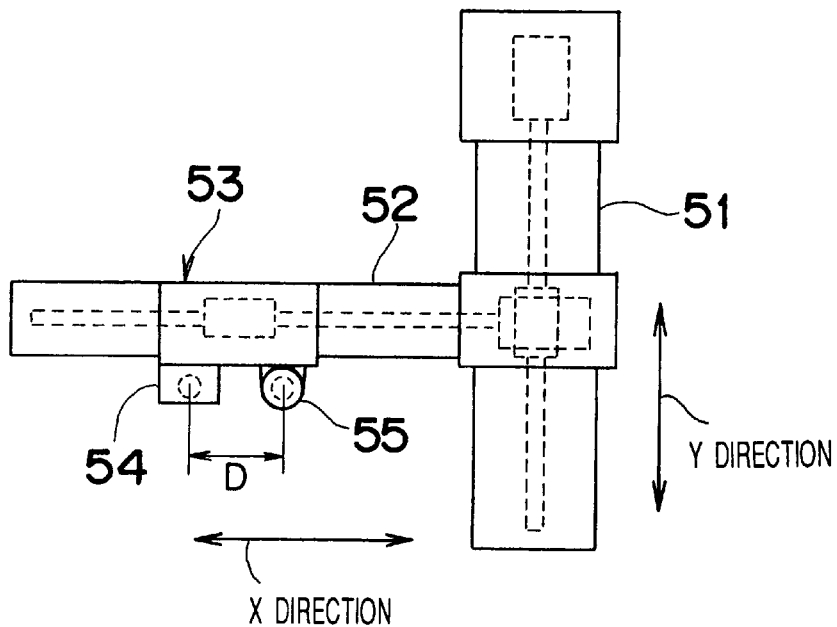
FIG. 12 is a plan view of the same prior art example.
Figure 13:
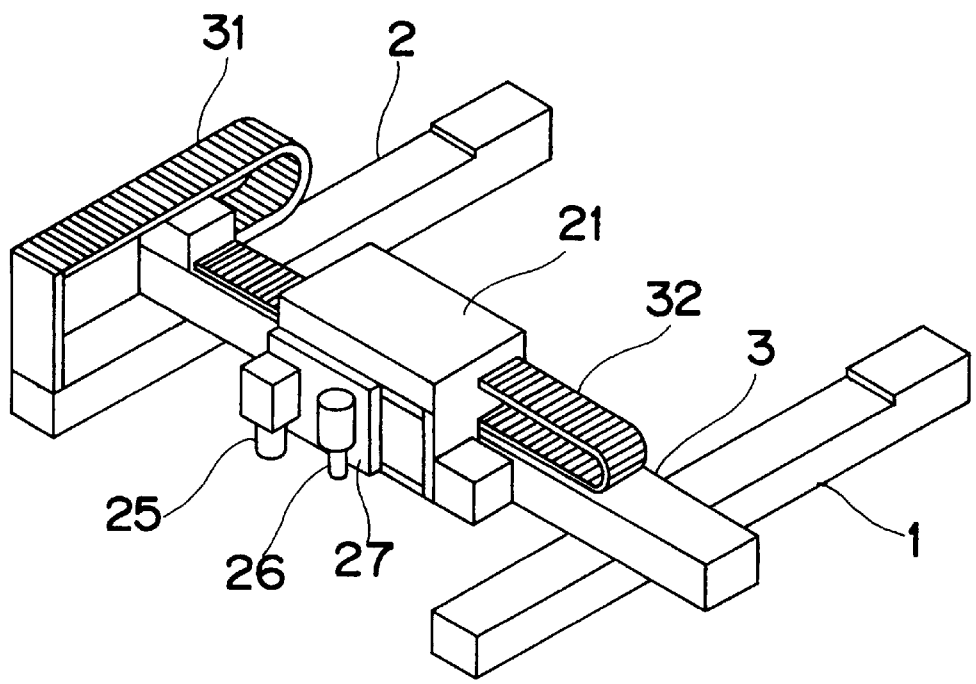
FIG. 13 is a perspective view of a rectangular coordinate type robot of another prior art example.
Figure 14:
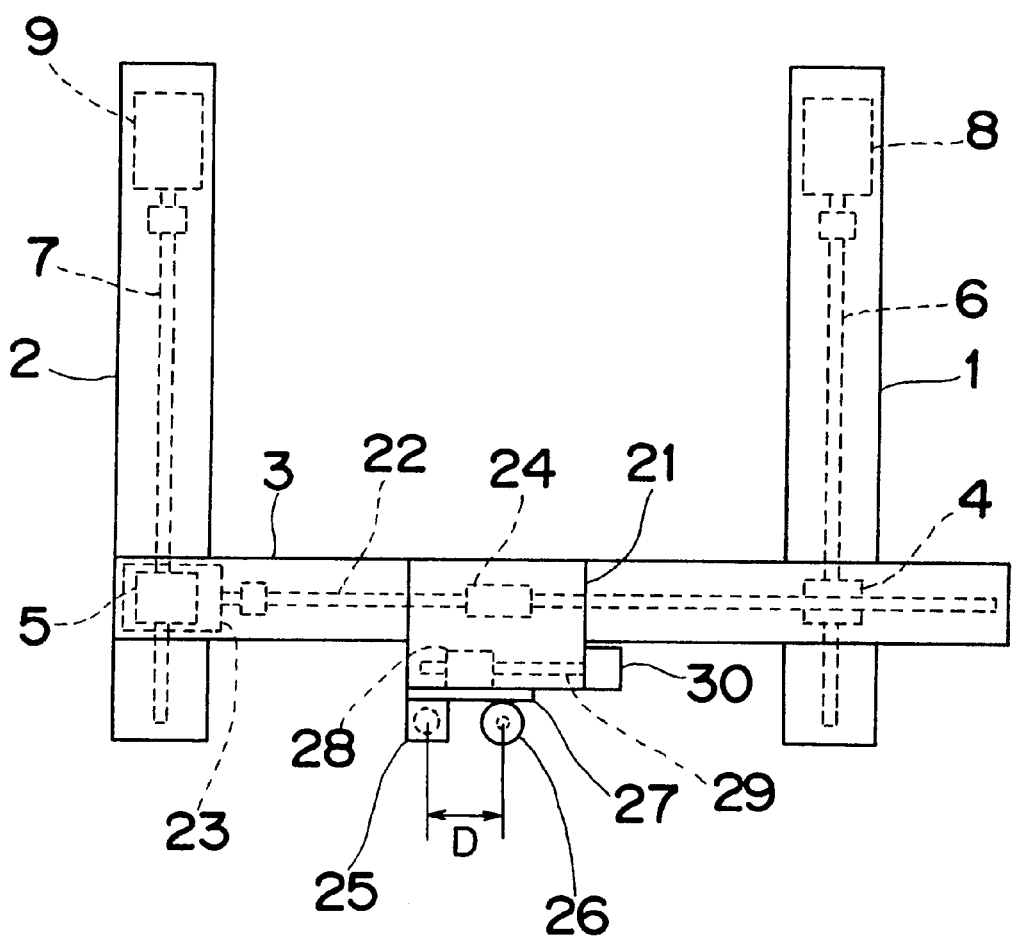
FIG. 14 is a plan view of the same prior art example.
Figure 15:
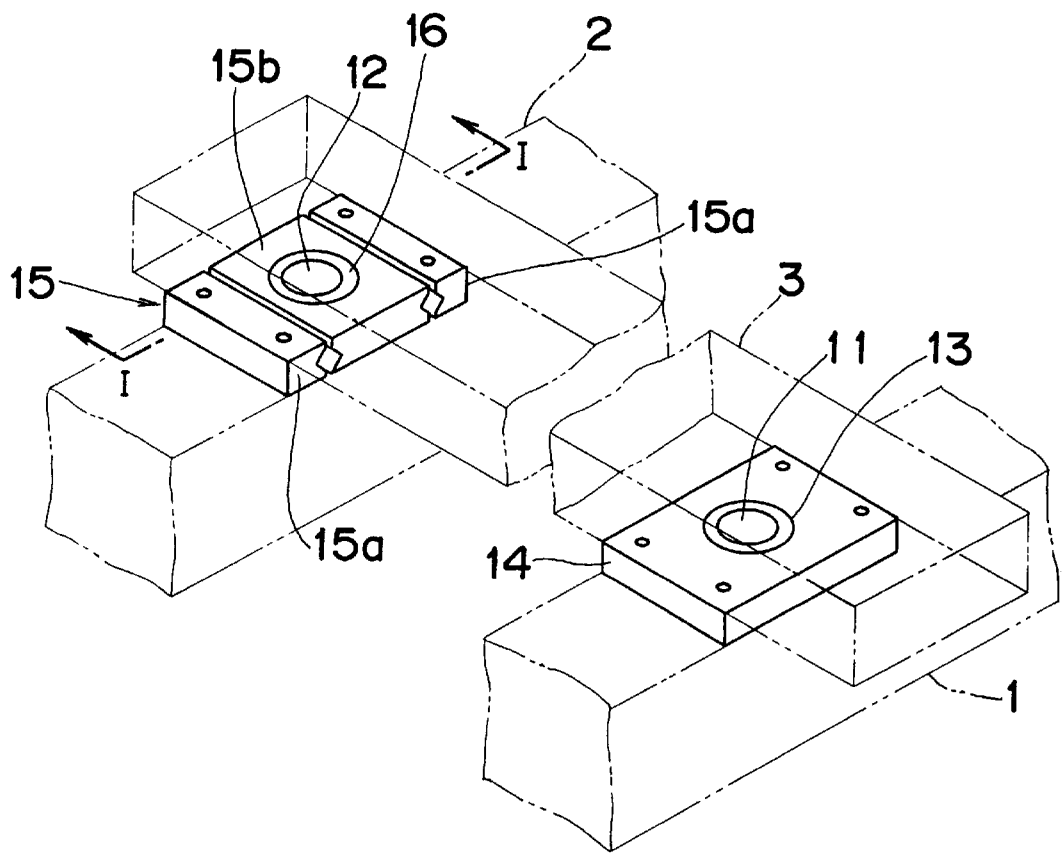
FIG. 15 is a perspective view showing the structure of a connecting portion of the same prior art example.
Figure 16:
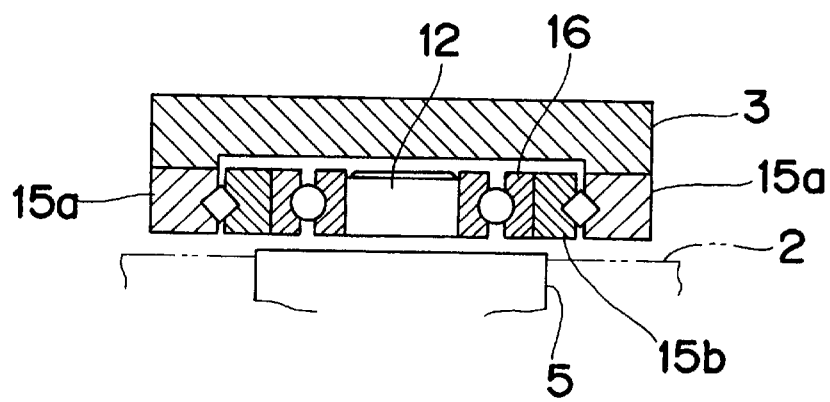
FIG. 16 is a sectional view showing the structure of the connecting portion of the same prior art example.

FIG. 1A shows a component mounting apparatus mounted with the rectangular coordinate type robot A of the first embodiment of the present invention. The basic structure of the rectangular coordinate type robot A includes a pair of Y-axis tables 103 and 104 that serve examples of the first tables arranged parallel to each other and an X-axis table 102 that serves as an example of the second table arranged between the Y-axis tables 103 and 104, similar to the prior art example shown in FIG. 12 and FIG. 13. The concrete structures of the connecting portions of the Y-axis tables 103 and 104 and the X-axis table 102 are different from those of the above-mentioned prior art example.

The overall structure of the component mounting apparatus will be described first.

A head section 101 that serves as an example of the second moving unit mounted with a suction nozzle 101a that serves as an example of the working member for sucking and holding components etc. by means of a vacuum pressure or the like for the mounting work or the like is movably mounted on the X-axis table 102 in the direction (X-axis direction) extending along the X-axis table 102. The X-axis table 102 has a device (a motor, for example) for moving the head section 101 in the X-axis direction with the device built into the X-axis table 102.

The Y-axis direction tables 103 and 104 have devices (motors, for example) for moving the X-axis table 102 in the Y-axis of the $Y_1$-axis extending along the Y-axis table 103 and the Y-axis direction of the $Y_2$-axis extending along the Y-axis table 104 with the devices built into the Y-axis tables 103 and 104.

The Y-axis table 103 and one end of the X-axis table 102 are connected together via a first connecting portion 105. The Y-axis table 104 and the other end of the X-axis table 102 are connected together via a second connecting portion 106.

The reference numeral 107 denotes an electronic component supplying unit for supplying electronic components arranged in a tape-shaped form, while the reference numeral 108 denotes a recognition unit. The recognition unit 108 recognizes the suction posture and other conditions of the electronic component sucked by the suction nozzle mounted on the head section 101 from the electronic component supplying unit 107, and the head section 101 executes a correcting operation of the suction posture and other conditions on the basis of the recognized data.

The reference numeral 109 denotes a conveyance section for moving a board, or the workpiece from the upstream side to the downstream side, while the reference numeral 110 denotes a tray lifter for taking out a supply tray on which components are set.

Figure 2:
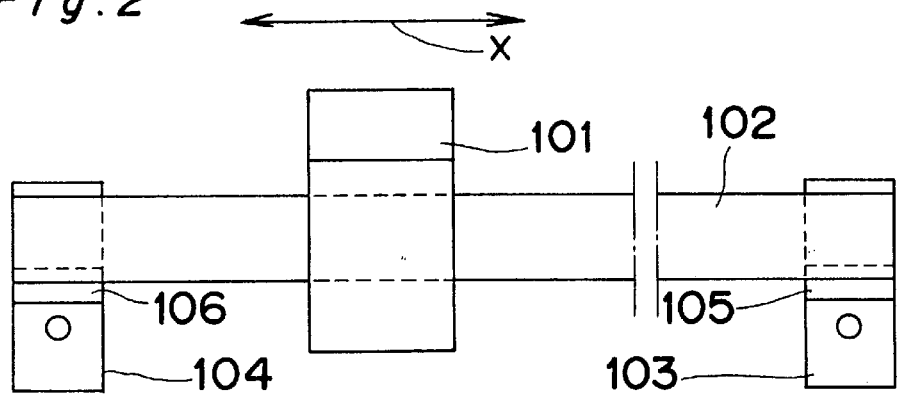
FIG. 2 is a front view of the rectangular coordinate type robot of the first embodiment.

FIG. 2 shows a relation between the Y-axis tables 103 and 104, the X-axis table 102, and the first and second connecting portions 105 and 106.

Figure 3:
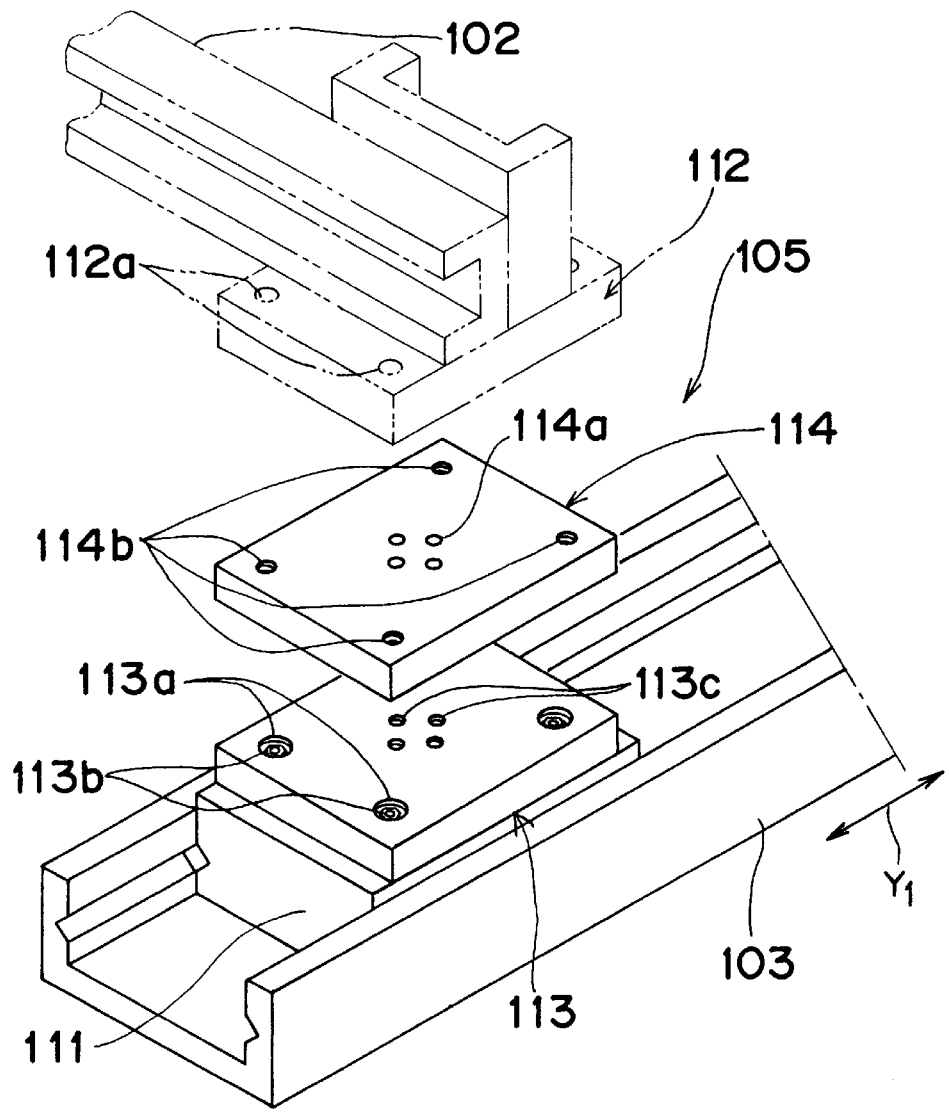
FIG. 3 is an exploded perspective view showing a first connecting portion of the first embodiment.

The first connecting portion 105 is constructed as shown in FIG. 3.

The first connecting portion 105 is constructed by a first moving unit 111 driven along the Y-axis table 103, a bracket 112, a fixing plate 113, and a connecting plate 114. In concrete, the fixing plate 113 is attached to the upper surface of the first moving unit 111 by inserting a bolt 113b into each of four holes 113a bored through the fixing plate 113, and the connecting plate 114 is attached to the upper surface of the fixing plate 113 by inserting a bolt (not shown) from each of four holes 114a (see FIG. 5) bored through the center portion of the connecting plate 114 into each of four threaded holes 113c formed at the center portion of the fixing plate 113. The bracket 112 is attached to the upper surface of the connecting plate 114 by inserting a bolt (not shown) from each of four holes 112a bored through the bracket 112 into each of four threaded holes 114b formed in the peripheral portion of the connecting plate 114, and one end of the X-axis table 102 is mounted on the bracket 112.

Figure 4:
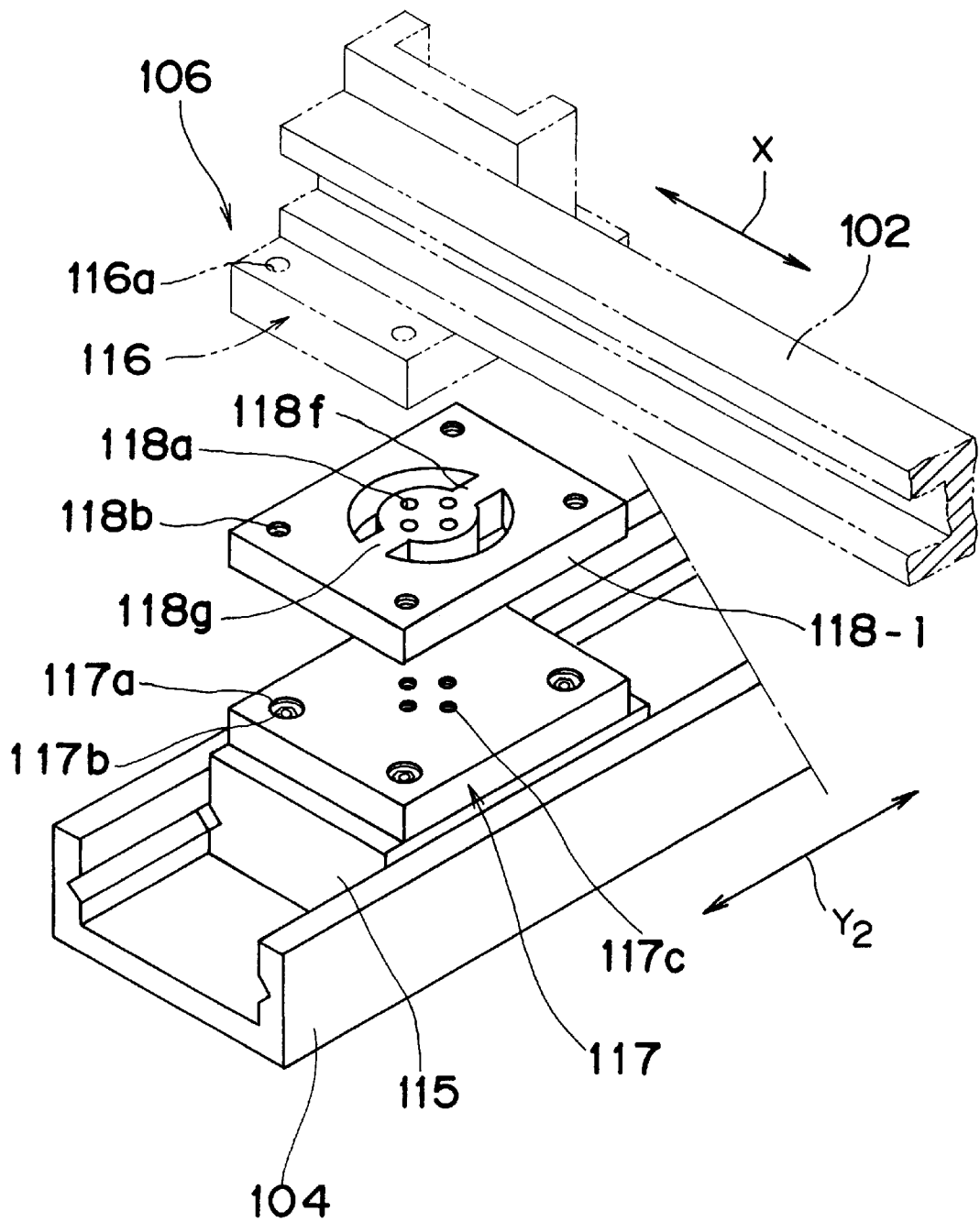
FIG. 4 is an exploded perspective view showing a second connecting portion of the first embodiment.
Figure 5:
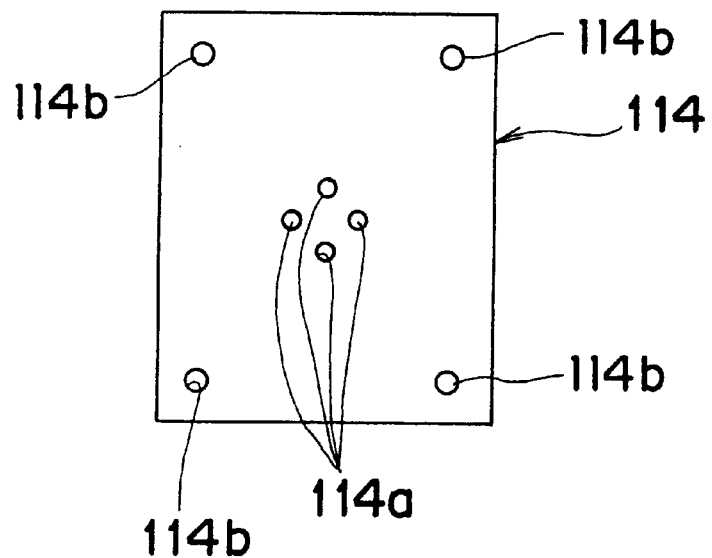
FIG. 5 is a plan view of a connecting plate used for the first connecting portion of the first embodiment.

The second connecting portion 106 is constructed as shown in FIG. 4.

The second connecting portion 106 is constructed by a first moving unit 115 driven along the Y-axis table 104, a bracket 116, a fixing plate 117, and a connecting plate 118-1. In concrete, the fixing plate 117 is attached to the upper surface of the first moving unit 115 by inserting a bolt 117b into each of four holes 117a bored through the fixing plate 117, and the connecting plate 118-1 is attached to the upper surface of the fixing plate 117 by inserting a bolt (not shown) from each of four holes 118a (see FIG. 6) bored at the center portion of the connecting plate 118-1 into each of four threaded holes 117c formed at the center portion of the fixing plate 117. The bracket 116 is attached to the upper surface of the connecting plate 118-1 by inserting a bolt (not shown) from each of four holes 116a bored through the bracket 116 into each of four threaded holes 118b formed in the peripheral portion of the connecting plate 118-1, and the other end of the X-axis table 102 is mounted on the bracket 116.

Figure 6:
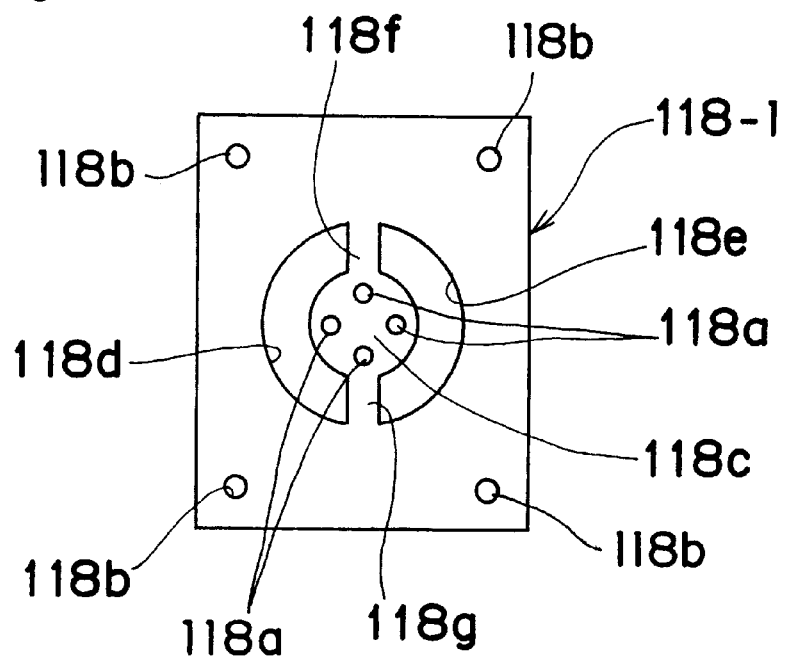
FIG. 6 is a plan view of a connecting plate used for the second connecting portion of the first embodiment.

As also shown in FIG. 6, the connecting plate 118-1 is formed to have thinned portions 118f and 118g, or an example of the thin connecting member that extends along the $Y_2$-axis direction and has a small thickness in the direction perpendicular to the $Y_2$-axis direction by boring semicircular holes 118d and 118e with part left on the peripheries of the center portion 118c where four holes 118a are bored. In concrete, a tool steel SK7 having a plate thickness of 12 mm was hardened to be used as the connecting plate 118-1.

Figure 1B:
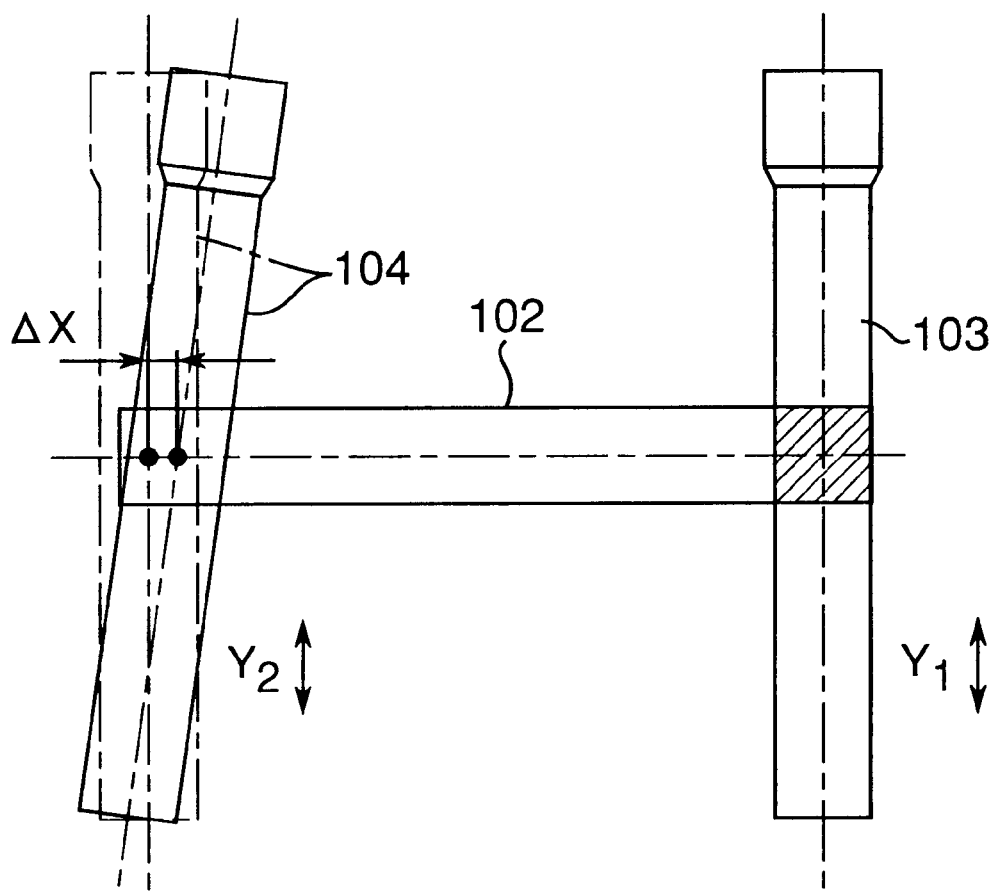
FIG. 1B is a view for explaining two Y-axis tables of the component mounting apparatus of FIG. 1A, the tables deviating from the parallel position thereof.
Figure 7:
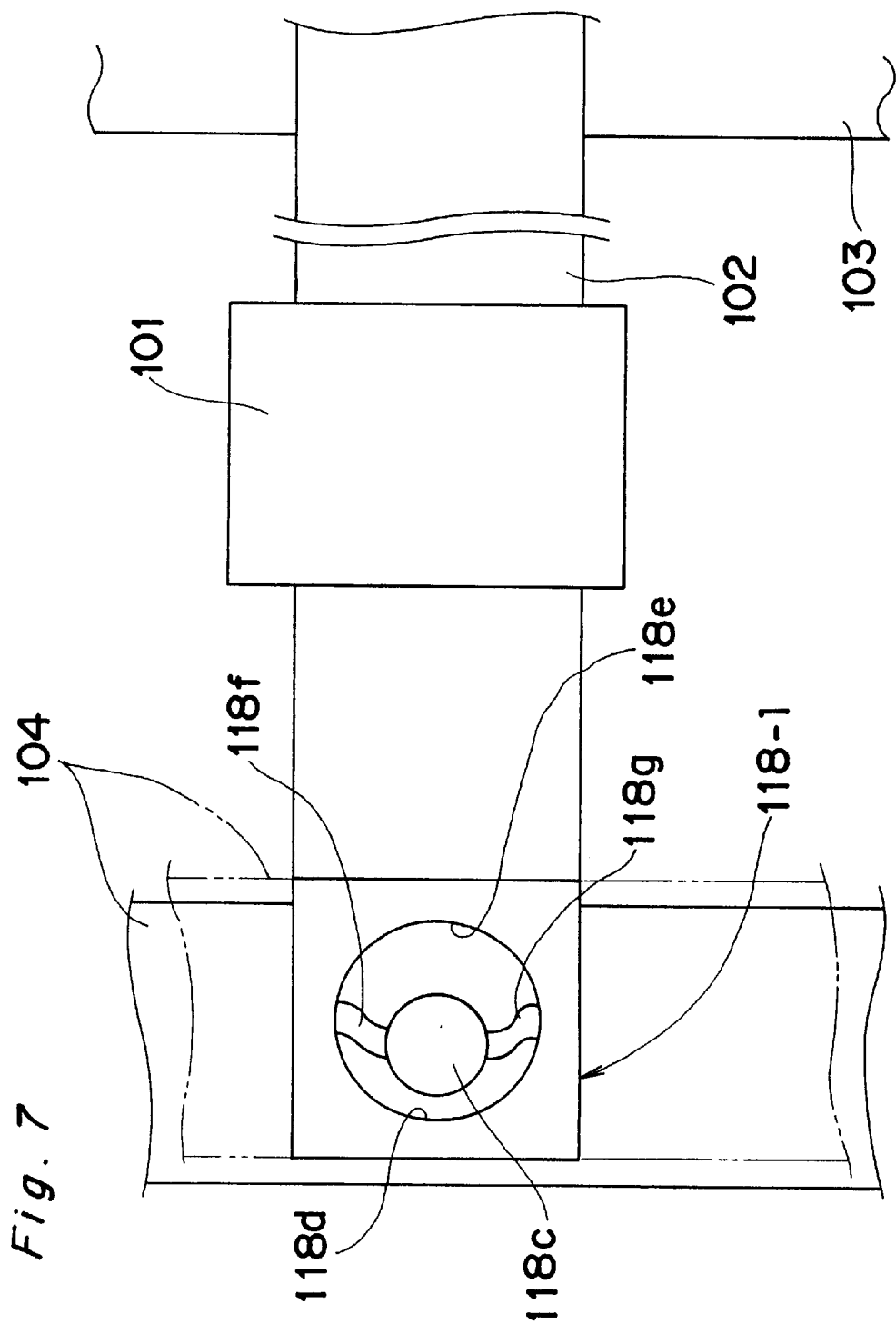
FIG. 7 is a schematic view for explaining the effect of the first embodiment.

With this arrangement, if the Y-axis table 104 is mounted while being inclined by an error Δx from the parallel position (position of the imaginary line) relative to the Y-axis table 103 as shown in the schematic views of FIG. 7 and FIG. 1B when mounting the Y-axis tables 103 and 104, then the thinned portions 118*f* and 118*g* of the connecting plate 118-1 that are formed so as to have a small thickness in the direction perpendicular to the $Y_2$-axis direction are deformed by their own resiliency to reduce the load in the driving stage, thereby allowing the X-axis table 102 to smoothly move in the directions of the $Y_1$ and $Y_2$-axes.

Furthermore, the thinned portions 118*f* and 118*g* are formed so as to extend in the $Y_2$-axis direction parallel to the $Y_1$-axis direction. Therefore, the thinned portions have rigidity in the directions of the $Y_1$ and $Y_2$-axes, and this allows the settling time in the positioning stage to be reduced and allows the operation to be executed without deteriorating the positioning accuracy.

Therefore, if this rectangular coordinate type robot is used as a movement mechanism of the component suction nozzle 101*a* of the mounting apparatus for mounting components on a board, then the thinned portions 118*f* and 118*g* are deformed by their own resiliency even when, for example, the Y-axis table 104 is mounted while being inclined by the error Δx from the parallel position (position of the imaginary line) relative to the Y-axis table 103, so that the load can be reduced in the driving stage and the X-axis table 102 can smoothly move in the directions of the $Y_1$ and $Y_2$-axes. Consequently, the movement of the component suction nozzle 101*a* can be made smooth without being influenced by the mounting error. Furthermore, the thinned portions 118*f* and 118*g* allow the reduction of the settling time in the positioning stage of the suction nozzle 101*a* and allows the execution of the operation without deteriorating the positioning accuracy of the suction nozzle 101*a* with respect to the component suction position and the board mounting position relative to the component supply tray or the component supply unit.

If the moving unit that moves in the $Y_1$-axis direction and the moving unit that moves in the $Y_2$-axis direction erroneously run in the component mounting apparatus, then the resiliency provided on the $Y_2$-axis side can effectively prevent the damage of the connecting portions.

<Second Embodiment>

Figure 8:
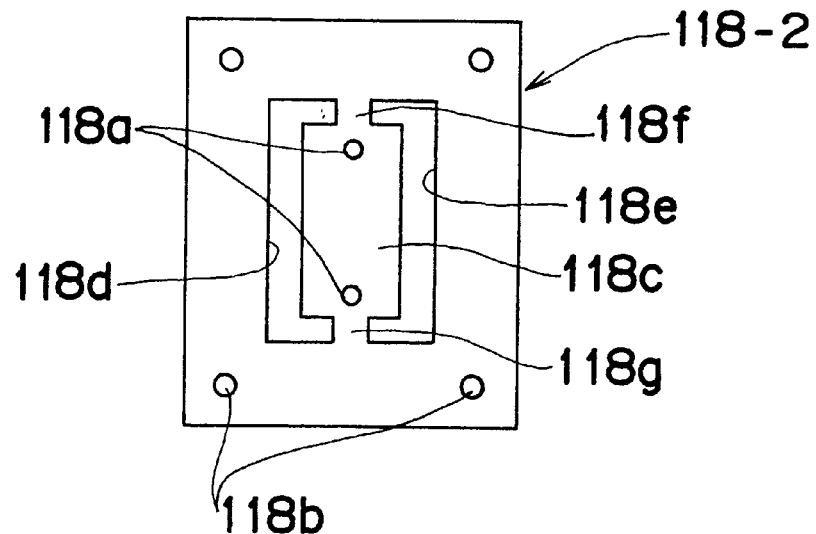
FIG. 8 is a plan view of a connecting plate used for a second connecting portion of a second embodiment.

FIG. 8 shows a connecting plate 118-2 of a rectangular coordinate type robot according to a second embodiment of the present invention, and the other components are the same as those of the rectangular coordinate type robot of the first embodiment. According to the connecting plate 118-1 of the rectangular coordinate type robot of the first embodiment, the semicircular holes 118*d* and 118*e* are bored for the formation of the thinned portions 118*f* and 118*g*. In contrast to this, the connecting plate 118-2 of the rectangular coordinate type robot of this second embodiment differs from the rectangular coordinate type robot of the first embodiment in the shape of the holes and the number of the mounting holes to be bored for the formation of the thinned portions. In concrete, each of the holes 118*d* and 118*e* for the formation of the thinned portions of the connecting plate 118-2 has a bracket "]" shape instead of the semicircular shape and there are provided two holes 118*a* instead of the four holes. The fixing plate 117 is formed with holes 117*c* corresponding to the holes 118*a*.

<Third Embodiment>

Figure 9:
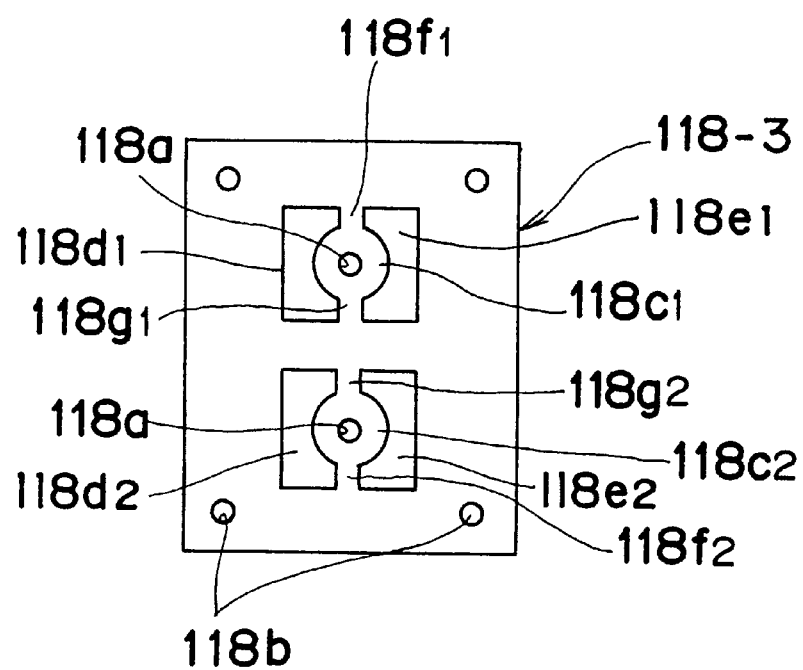
FIG. 9 is a plan view of a connecting plate used for a second connecting portion of a third embodiment.

FIG. 9 shows a connecting plate 118-3 of a rectangular coordinate type robot according to a third embodiment of the present invention, and the other components are the same as those of the rectangular coordinate type robot of the first embodiment. According to the connecting plate 118-1 of the rectangular coordinate type robot of the first embodiment, the center portion 118*c* is supported by the thinned portions 118*f* and 118*g*. In contrast to this, according to the connecting plate 118-3 of the rectangular coordinate type robot of this third embodiment, a fixing portion $118c_1$ supported by thinned portions $118f_1$ and $118g_1$ and a fixing portion $118c_2$ supported by thinned portions $118f_2$ and $118g_2$ are fixed to the first moving unit 115. According to the connecting plate 118-3, each of the shapes of holes $118d_1$, $118e_1$, $118d_2$ and $118e_2$ bored for the formation of the thinned portions is roughly bracket "]" shape, and there are provided two holes 118*a*. The fixing plate 117 is formed with holes 117*c* corresponding to the holes 118*a*.

<Fourth Embodiment>

Figure 10:
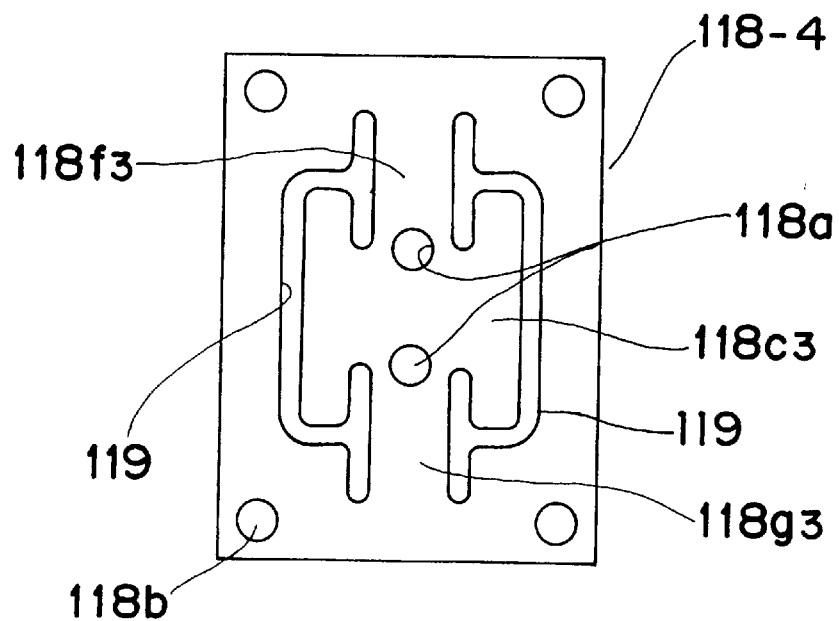
FIG. 10 is a plan view of a connecting plate used for a second connecting portion of a fourth embodiment.
Figure 11:
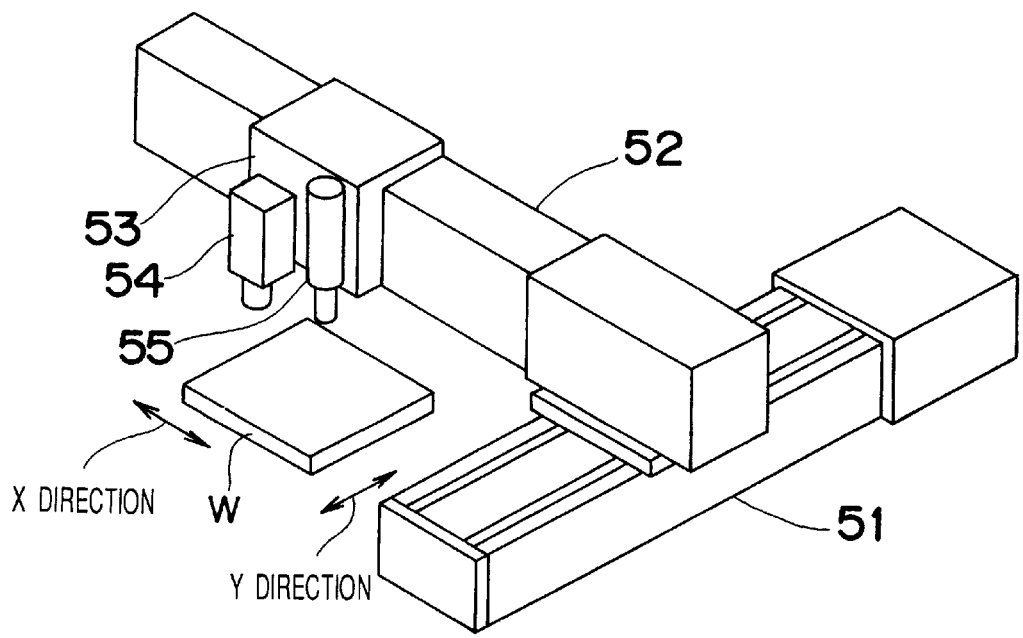
FIG. 11 is a perspective view of a rectangular coordinate type robot of a prior art example.

FIG. 10 shows a connecting plate 118-4 of a rectangular coordinate type robot according to a fourth embodiment of the present invention, and the other components are the same as those of the rectangular coordinate type robot of the first embodiment. According to the connecting plate 118-1 of the rectangular coordinate type robot of the first embodiment, the semicircular holes 118*d* and 118*e* are bored so that the center portion 118*c* is supported by the thinned portions 118*f* and 118*g*. In contrast to this, according to the connecting plate 118-4 of the rectangular coordinate type robot of this fourth embodiment, two through slit grooves 119 of a width of about 0.2 mm are formed by a laser beam through a plate-shaped block to form thinned portions $118f_3$ and $118g_3$ so that the fixed side and the movable side of the plate-shaped block are connected together via the thinned portion, and a center portion $118c_3$ is formed in the portion that is roughly surrounded by the two slit grooves 119. The fixing plate 117 is formed with holes 117*c* corresponding to the holes 118*a*.

A resiliency can be provided merely by the cutting with the laser or the like, and therefore, cost reduction can be achieved.

Only the second connecting portion 106 out of the first and second connecting portions 105 and 106 is made to have the rigidity in the direction of the Y-axis table and the resiliency in the direction extending along the X-axis table 102 in each of the aforementioned embodiments. However, both the first and second connecting portions 105 and 106 may also be made to have the rigidity in the direction of the Y-axis tables and the resiliency in the direction extending along the X-axis table 102. In this case, it is also acceptable to employ plates having different strength of resiliency as exemplified by the employment of a plate having a bending stress of 982 kgf/cm² and a deflection of 0.2 mm for the connecting plates 118-1 through 118-4 and the employment of a plate having a bending stress of 1969 kgf/cm² and a deflection of 0.05 mm similar to the constructions of the connecting plates 118-1 through 118-4 in place of the connecting plate 114.

As described above, according to the present invention, the connecting member for connecting the first table with the second table has rigidity in the movement direction of the first moving unit that can move along the first table and resiliency in the direction extending along the second table. Therefore, this connecting member becomes a rigid body in the movement direction of the second table relative to the first table, so that the member can achieve the movement and the positioning operation of the second table without deteriorating the accuracy nor prolonging the settling time nor increasing the sliding resistance or the like by being elastically deformed with respect to the deviation in the direction extending along the second table due to the mounting of the pair of first tables and the processing accuracy.

The entire disclosure of Japanese Patent Application No. 8-246764 filed on Sep. 19, 1996, including specification, claims, drawings, and summary is incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A rectangular coordinate type robot, comprising:
    a pair of first tables that are juxtaposed with a space therebetween and provided with first moving units, respectively, guided along the first tables;
    a second table having one end connected to the first moving unit provided for one of the first tables and the other end connected to the first moving unit provided for the other first table; and
    a second moving unit that is movable along the second table and is provided with a working member,
    wherein at least one of a first connecting portion of said one end of the second table and one of the first moving units and a second connecting portion of the other end of the second table and the other of the first moving units is connected via a connecting member having a rigidity in a movement direction in which the corresponding first moving unit moves and a resiliency in a direction extending along the second table.

2. A rectangular coordinate type robot as claimed in claim 1, wherein
    the connecting member is provided by a plate-shaped block that has its center portion made to serve as a fixed side to be fixed to the corresponding first moving unit,
    the plate-shaped block has its peripheral portion made to serve as a movable side to be fixed to the second table, and through holes are formed in the plate-shaped block so that the fixed side and the movable side of the plate-shaped block are connected via thinned portions.

3. A rectangular coordinate type robot as claimed in claim 2, wherein
    the through holes formed through the plate-shaped block so that the fixed side and the movable side of the plate-shaped block are connected via the thinned portions are slit grooves.

4. A rectangular coordinate type robot as claimed in claim 3, wherein
    the thinned portions are portions that extend in the movement direction in which the corresponding first moving unit moves so as to have the rigidity in the movement direction and are thin in a direction crossing the movement direction so as to have the resiliency in the crossing direction.

5. A rectangular coordinate type robot as claimed in claim 1, wherein
    both of said first and second connecting portions provide connection via connecting members, and both of the connecting members have the rigidity in the movement direction of the corresponding first moving unit and have the resiliency, capable of reducing a sliding resistance by being elastically deformed in response to a deviation in the direction extending along the second table due to mounting and processing accuracy of the pair of first tables, in the direction extending along the second table.

6. A rectangular coordinate type robot as claimed in claim 4, wherein
    the thinned portions are portions that extend in the movement direction in which the corresponding first moving unit moves so as to have the rigidity in the movement direction and are thin in a direction crossing the movement direction so as to have the resiliency in the crossing direction.

7. A rectangular coordinate type robot as claimed in claim 3, wherein
    both of said first and second connecting portions provide connection via connecting members, and both of the connecting members have the rigidity in the movement direction of the corresponding first moving unit and have the resiliency, capable of reducing a sliding resistance by being elastically deformed in response to a deviation in the direction extending along the second table due to mounting and processing accuracy of the pair of first tables, in the direction extending along the second table.

8. A rectangular coordinate type robot as claimed in claim 4, wherein
    both of said first and second connecting portions provide connection via connecting members, and both of the connecting members have the rigidity in the movement direction of the corresponding first moving unit have the resiliency, capable of reducing a sliding resistance by being elastically deformed in response to a deviation in the direction extending along the second table due to mounting and processing accuracy of the pair of first tables, in the direction extending along the second table.

9. A rectangular coordinate type robot as claimed in claim 5, wherein
    both of said first and second connecting portions provide connection via connecting members, and both of the connecting members have the rigidity in the movement direction of the corresponding first moving unit and have the resiliency, capable of reducing a sliding resistance by being elastically deformed in response to a deviation in the direction extending along the second table due to mounting and processing accuracy of the pair of first tables, in the direction extending along the second table.

10. A rectangular coordinate type robot as claimed in claim 9, wherein
    both of said first and second connecting portions provide connection via connecting members, and both of the connecting members have the rigidity in the movement direction of the corresponding first moving unit and have the resiliency, capable of reducing a sliding resistance by being elastically deformed in response to a deviation in the direction extending along the second table due to mounting and processing accuracy of the pair of first tables, in the direction extending along the second table.

11. A rectangular coordinate type robot, comprising:
    a pair of first tables that are juxtaposed with a space therebetween and provided with first moving units, respectively, guided along the first tables;
    a second table having one end connected to one of the first moving units provided for one of the first tables and the other end connected to the other of the first moving unit provided for the other first table; and
    a second moving unit that moves while being guided along the second table and is provided with a working member,
    wherein said one end of the second table is fixed to said one of the first moving units, and a connecting portion of the other end of the second table and said other of the first moving units is connected via a connecting member having a rigidity in a movement direction in which said other of the first moving units moves and a resiliency in a direction extending along the second table.

12. A rectangular coordinate type robot as claimed in claim 10, wherein the connecting member is provided by a plate-shaped block that has its center portion made to serve as a fixed side to be fixed to said other of the first moving units, the plate-shaped block has its peripheral portion made to serve as a movable side to be fixed to the second table, and through holes are formed in the plate-shaped block so that the fixed side and the movable side of the plate-shaped block are connected via thinned portions.

13. A rectangular coordinate type robot as claimed in claim 12, wherein the through holes formed through the plate-shaped block so that the fixed side and the movable side of the plate-shaped block are connected via the thinned portions are slit grooves.

14. A rectangular coordinate type robot as claimed in claim 2, wherein the connecting member having the rigidity in the movement direction of said other of the first moving units has the resiliency, capable of reducing a sliding resistance by being elastically deformed in response to a deviation in the direction extending along the second table due to mounting and processing accuracy of the pair of first tables, in the direction extending along the second table.

15. A rectangular coordinate type robot as claimed in claim 7, wherein the connecting member having the rigidity in the movement direction of said other of the first moving units has the resiliency, capable of reducing a sliding resistance by being elastically deformed in response to a deviation in the direction extending along the second table due to mounting and processing accuracy of the pair of first tables, in the direction extending along the second table.

16. A rectangular coordinate type robot as claimed in claim 8, wherein the connecting member having the rigidity in the movement direction of said other of the first moving units has the resiliency, capable of reducing a sliding resistance by being elastically deformed in response to a deviation in the direction extending along the second table due to mounting and processing accuracy of the pair of first tables, in the direction extending along the second table.

\* \* \* \* \*